United States Patent [19]

Schoen et al.

[11] Patent Number: 5,242,715

[45] Date of Patent: Sep. 7, 1993

[54] PROCESS FOR COATING OR BONDING ELECTRONIC COMPONENTS AND SUBASSEMBLIES

[75] Inventors: Lothar Schoen, Neunkirchen; Bernhard Stapp, Kalchreuth; Heiner Bayer, Olching; Helmut Markert, Nuremberg; Volker Muhrer, Fuerth, all of Fed. Rep. of Germany

[73] Assignee: Siemens Aktiengesellschaft, Munich, Fed. Rep. of Germany

[21] Appl. No.: 835,805

[22] Filed: Feb. 14, 1992

[30] Foreign Application Priority Data

Feb. 18, 1991 [DE] Fed. Rep. of Germany ....... 4104958

[51] Int. Cl.$^5$ .............................................. B05D 1/00
[52] U.S. Cl. ..................................... 427/386; 427/96; 427/558; 427/559
[58] Field of Search ................. 427/558, 559, 96, 386, 427/385.5

[56] References Cited

U.S. PATENT DOCUMENTS

| | | | |
|---|---|---|---|
| 4,058,401 | 11/1977 | Crivello | 96/115 R |
| 4,138,255 | 2/1979 | Crivello | 96/35.1 |
| 4,173,476 | 11/1979 | Smith et al. | 430/280 |
| 4,216,288 | 8/1980 | Crivello | 430/280 |
| 4,360,968 | 11/1982 | D'Amico et al. | 427/558 |
| 4,933,206 | 6/1990 | Cox | 427/558 |
| 5,030,478 | 7/1991 | Lin et al. | 427/130 |
| 5,034,244 | 7/1992 | Berrer et al. | 427/376 |
| 5,089,063 | 2/1992 | Harrah et al. | 427/327 |

FOREIGN PATENT DOCUMENTS 61-283618 12/1986 Japan .
56-152833 3/1988 Japan .

OTHER PUBLICATIONS

C. A. May, Y. Tanaka, "Epoxy Resins", Marcel Dekker Inc., New York 1973, pp. 283–296.
"Chemical Abstracts", vol. 96 (1982), No. 182205h.
"Chemical Abstracts", vol. 99 (1983), No. 141034v.
N. S. Allen, "Developments in Polymer Photochemistry-2", Applied Science Publishers Ltd., London 1981, pp. 13 and 14.

Primary Examiner—Anthony McFarlane
Attorney, Agent, or Firm—Kenyon & Kenyon

[57] ABSTRACT

In a process for coating or bonding electronic components and subassemblies with reaction resin mixtures that are stable in storage at room temperature as a one-component system for several months, reaction resin mixtures are used, which contain the following components:
- a cationically hardenable, solvent-free epoxy resin;
- a triarylsulphonium salt with hexafluorophosphate, -arsenate or -antimonate as anion, with a mass concentration of 0.01 to 5% (relative to epoxy resin); and
- a benzylthiolanium salt with hexafluorophosphate, -arsenate or -antimonate as anion, with a mass concentration of 0.01 to 5% (relative to epoxy resin); as well as possibly customary additives.

These reaction resin mixtures are hardened through UV radiation and thermally.

12 Claims, No Drawings

PROCESS FOR COATING OR BONDING ELECTRONIC COMPONENTS AND SUBASSEMBLIES

FIELD OF THE INVENTION

The invention relates to a process for coating or bonding electronic components and subassemblies with reaction resin mixtures that are storage stable.

BACKGROUND OF THE INVENTION

Many times epoxy resins, which are thermally hardened —in the course of a polyaddition reaction—with carboxylic anhydrides, amines or mercaptans, are used as reaction resins for coating, that is lacquering, covering or sheathing, or for bonding electronic components and subassemblies (*Advances in Polymer Science*, vol. 80 (1986), pp. 173-202). Also known are thermally hardenable epoxy resin mixtures, in which a polymerization of the epoxy resins is the basis of the hardening reaction. The polymerization can be brought about by tertiary amines or Lewis acids (C.A. May, Y. Tanaka Epoxy Resins, Marcel Dekker Inc., N.Y. 1973, pp. 283-296) or by onium salts. Thus, U.S. Pat. No. 4,216,288 discloses using an aromatic onium salt as an initiator, whereby, in addition, reductive agents can be present. From the Japanese Published Patent Application 56-152833, thermally hardenable epoxy resin compositions are known (see: *Chemical Abstracts*, vol. 96 (1982), no. 182205h), which contain sulphonium salts and thiophenol—as an accelerator. Also described are thermally hardenable mixtures which are storage stable and have benzylthiolanium salts (Japanese Published Patent Application 58-037003 or *Chemical Abstracts*, vol. 99 (1983), no. 141034V).

A disadvantage often encountered when epoxy resins are thermally hardened is the reduction in the viscosity of the resins in the warm-up phase before the hardening. In the case of lacquerings for example, this leads to uneven layer thicknesses and so-called lacquer runs. Also, when unhoused, bonded ICs on printed-circuit boards and hybrid circuits are covered locally by means of a reaction resin drop, this leads to an undesirable deliquescence of the drop contour. Moreover, thermal hardening processes are only conditionally suited for automated assembly lines, since the hardening process is time- and space-intensive.

In addition to the thermally activated hardening of epoxy resins, hardening reactions are also known, which are initiated by UV radiation - in the presence of photoinitiators. Effective photoinitiators are triarylsulphonium salts (see for example: U.S. Pat. Nos. 4,058,401, 4,138,255 and 4,173,476). An important characteristic of the UV initiated hardening is that the hardening reaction only takes place in the areas accessible to light. It is known that reactions initiated with triarylsulphonium salts also continue after termination of the UV radiation (see: N.S. Allen *Developments in Polymer Photochemistry - 2*, Applied Science Publishers Ltd., London 1981, pp. 13 and 14), however, this takes place only in the areas where the photoinitiator had been fragmented by UV radiation. However, a thermal hardening cannot be initiated with triarylsulphonium salts (see: *Farbe +Lack* [Dyes + Lacquer], 93rd year (1987), pp. 803-807). Therefore, UV-hardenable epoxy resin mixtures can only find limited application in the electronics field, since when electronic components and subassemblies are coated (lacquered, covered or sheathed) and bonded, areas that are shaded from light are often present.

This difficulty presents itself, for example, when lacquering printed-circuit board assemblies. The lacquers are mostly applied to the flat subassemblies by dipping them - to protect the circuit from aggressive environmental influences. A UV-hardenable lacquer, which would be advantageous for technical and economical reasons, cannot be applied in this case, because, as a result of the dipping process, the lacquer also penetrates into areas, for example gaps between the printed circuit board and components, where it is not covered by the UV radiation, and therefore can also not be hardened.

The application of UV-hardenable epoxy resins is also not possible when the UV light is so strongly absorbed or scattered in the upper layers as the result of additives, such as fillers, pigments, dyes and photoinitiators, or other resin components, that the UV intensity is no longer adequate in the deeper layers. This is the case, for example, when unhoused ICs on hybrid circuits are covered locally by means of a reaction resin drop. For technical reasons, such a reaction resin must be heavily loaded with mineral fillers and moreover have carbon black or a dye added to it. In this manner, however, the UV radiation is prevented from penetrating into the deeper areas.

SUMMARY OF THE INVENTION

The object of the invention is to provide a process for coating or bonding electronic components and subassemblies with reaction resin mixtures that are storage stable, which enables the reaction resin mixtures to be hardened both at the spots that are accessible to light as well as at the spots that are shaded from light.

In accordance with the invention, this is achieved by providing reaction resin mixtures which contain
- a cationically hardenable, solvent-free epoxy resin;
- a triarylsulphonium salt with hexafluorophosphate, hexafluoroarsenate or hexafluoroantimonate as anion, with a mass concentration of 0.01 to 5 % (relative to epoxy resin);
- a benzylthiolanium salt with hexafluorophosphate, hexafluoroarsenate or hexafluoroantimonate as anion, with a mass concentration of 0.01 to 5 % (relative to epoxy resin);
- as well as optionally customary additives; The reaction resin mixtures are hardened through UV radiation and thermally.

DETAILED DESCRIPTION OF THE INVENTION

Surprisingly, it turns out that triarylsulphonium salts and benzylthiolanium salts can be present at the same time in cationically hardenable epoxy resin mixtures and that, nevertheless, such a high storage stability is reached that the mixtures can still be processed as one-component systems, even after several months. In a technical respect, it is also advantageous that, on the one hand, the mixtures exhibit a high UV reactivity and, on the other hand, a thermal hardening can take place at moderate temperatures. Therefore, it is possible with the process according to the invention to implement a coating or bonding of electronic components and subassemblies, even when areas are present that are shaded from light, as is the case underneath components and in deeper layers.

Another advantage of the process according to the invention is that solvent-free reaction resin mixtures are used. Up until now, in the manufacturing of protective coatings on flat printed-circuit board subassemblies, solvent-containing lacquer systems have been applied, in which the film formation takes place through physical drying, that is by evaporating or vaporizing the solvents. The application of organic solvents to dilute the binding agent until a workable viscosity is achieved is, however, disadvantageous for various reasons. The low flash point of the solvents and the associated danger of explosion and fire requires, on the one hand, cost-intensive protection and monitoring measures when the lacquer is manufactured and processed. On the other hand, to protect the environment, it is necessary to purify the exhaust air from hot-air ovens of organic solvents. This entails considerable expense. Furthermore, as far as the dipping operation is concerned, one should consider that the solvent evaporating out of the immersion basin must be constantly replaced to ensure a uniform lacquer viscosity during the processing. These problems are avoided in the process according to the invention through the application of a solvent-free and, nevertheless, low-viscosity system. Therefore, for example, when flat subassemblies are lacquered, the lacquer can flow in underneath, that is it can also penetrate into the narrow gaps between the component and the printed circuit board.

As already explained, with the process according to the invention, the reaction resin mixtures are hardened both through UV radiation and also thermally. The thermal hardening takes place advantageously at temperatures from 80° to 200° C.; preferably at temperatures from 80° to 150° C.

In the process according to the invention, glycidyl ethers on the basis of bisphenol A, bisphenol F or novolaks preferably find application as an epoxy resin. Glycidyl ethers of glycerine and pentaerythritol are also suitable. Furthermore, linear, aliphatic epoxy resins, such as epoxidized polybutadiene and epoxidized soy bean oil, and cycloaliphatic epoxy resins, for example 3,4-epoxycyclohexylmethyl-3',4'-epoxycyclohexanecarboxylate are preferred. The latter are distinguished in particular by a high reactivity as well as a low viscosity. Furthermore, mixtures of cationically hardenable epoxy resins can also be used.

To increase the hardening rate and to improve the mechanical molded material properties, hydroxyl-group-containing organic compounds can advantageously be added to the epoxy resin mixtures, that is hydroxyl- or polyhydroxyl compounds, as well as their vinyl ethers. Polyoxyalkylenepolyols, polyalkylenepolyols and cycloaliphatic hydroxyl compounds are preferably used as hydroxyl-group-containing compounds. In addition to vinyl ethers of the mentioned type, other vinyl-group-containing compounds can also be applied.

Triarylsulphonium salts of the following structure are preferably used as photoinitiators for the UV-hardening of the light-accessible areas:

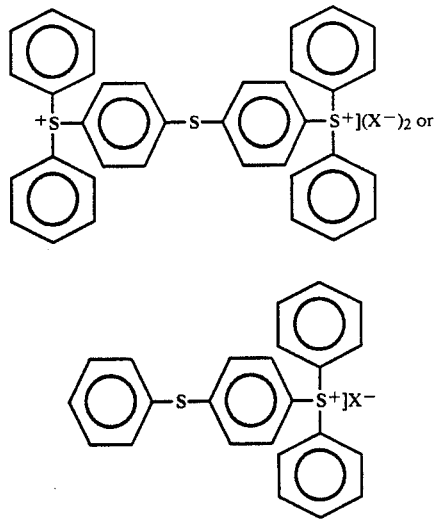

with $X^- = PF_6^-$, $AsF_6^-$ or $SbF_6^-$.

Examples of these are 4-diphenylsulphonio-diphenyl-sulphide-hexafluoroantimonate and bis[4-(diphenylsulphonio)phenyl]sulphide-bishexafluoroantimonate. The triarylsulphonium salts find application in a concentration of 0.01 to 5 %, relative to epoxy resin; the triarylsulphonium salt content preferably amounts to 0.05 to 3 %.

The hardening of the reaction resin mixtures in areas which are not accessible to the UV light, for example underneath components or in deeper layers of UV-light absorbing or scattering epoxy resin formulations, is effected by an initiator which is capable of being thermally activated. Preferably, benzylthiolanium salts of the following structure are used for this:

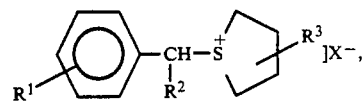

where the following applies:
$R^1$ = hydrogen, alkyl, aryl, alkoxy, thioether, halogen, CN or $NO_2$;
$R^2$ = hydrogen, alkyl or aryl;
$R^3$ = hydrogen, alkyl or aryl or the thiolane ring is the constituent of an aromatic system;
$X^- = PF_6^-$, $AsF_6^-$ or $SbF_6^-$.

Preferably unsubstituted benzylthiolanium salts are used, in particular benzylthiolaniumhexafluoroantimonate. The benzylthiolanium salts find application in a concentration of 0.01 to 5 %, preferably in a concentration of 0.05 to 3%, in each case relative to epoxy resin.

To increase the storage stability even more, stabilizing components can be advantageously added to the reaction resin mixtures. It has proven advantageous to use tertiary amines, which are applied in a concentration of 0.001 to 1 %, preferably 0.001 to 0.05%, in each case relative to epoxy resin, as stabilizing agents. For such tertiary amines, ethanol amines, such as diisopropylaminoethanol and triethanolamine are preferred. However, (meth)acrylates, in a concentration of 1 to 30%, relative to epoxy resin, can also be advantageously applied for this purpose. Methacrylates, such as polypropyleneglycolmonomethacrylate are preferred.

At the indicated concentrations, compounds of the mentioned type exhibit an excellent stabilizing effect, however, without considerably influencing the reactivity of the initiators.

Mineral or organic fillers as well as other known admixtures and additions, such as thixotroping agents, degasification auxiliary agents, wetting agents, adhesive agents, dyes and pigments, can be added as additives to the reaction resin mixtures. The properties of the unhardened mixtures, or rather the molded material properties can be changed by means of the additives.

The process according to the invention is suited for coating and bonding electronic components and subassemblies, particularly when in this case—depending on the construction—areas shaded from light appear and-/or the penetration depth of UV radiation into the resin is too low for a complete hardening. Preferred fields of application are the sheet-type coating of electronic subassemblies (with areas shaded from light), in particular the lacquering of flat printed-circuit board subassemblies, as well as the local covering of microelectronic components, in particular unhoused, bonded ICs. In the last-mentioned case, reaction resin mixtures containing dye or pigment with a high mineral filler content find application.

The hardening of the light-accessible areas takes place in the process according to the invention through irradiation with UV light. As radiation sources all customary UV sources can be used in principle, such as xenon-, wolfram-, mercury- and metal-halide radiators, as well as widely varying types of UV lasers, for example excimer and Nd/YAG lasers. In this case, the UV emission from the radiators can take place as continuous or pulsed radiation.

The thermal hardening in the areas shaded from light can take place at the same time as the UV irradiation, immediately following it, or not until later, in a separate thermal process. This occurs, as already explained, at temperatures ranging from 80° to 200° C., preferably 80° to 150° C. The heat required for thermal hardening can be supplied through infrared radiators, infrared lasers or heated circulating air. However, it is also possible to utilize the IR radiation component emitted by an UV radiator, as is the case for example with mercury and xenon radiators, or to utilize the heat convectively transmitted from a hot radiator wall. Furthermore, it is possible to supply the required heat by means of heat conduction via the substrate or through the component parts.

The invention shall be explained in still greater detail on the basis of the following exemplified embodiments.

EXAMPLES 1-7

In Examples 1 through 7, epoxy resin mixtures are specified, which are suited for an application using the dispenser method. The mixtures specified in examples 2, 3, 6 and 7 contain carbon black and are therefore not accessible to a UV hardening in deeper layers. This is not the case with the mixtures according to the examples 1, 4 and 5, which do not contain any carbon black.

The composition of the applied mixtures is set forth in Table 1. The individual constituents are specified in mass parts; the arylsulphoniumhexafluoroantimonates are present as a solution in propylene carbonate (commercial product). The mixtures are homogenized for 0.5 h at room temperature under a reduced pressure (<10 mbar) and with the exclusion of UV light.

TABLE 1

| Composition of the Mixtures According to Example 1 through 7 | | | | | | | |
|---|---|---|---|---|---|---|---|
| Example | 1 | 2 | 3 | 4 | 5 | 6 | 7 |
| Cresol novolak epoxide | 33.3 | 33.3 | 33.3 | 33.3 | 33.3 | 33.3 | 33.3 |
| Cycloaliphatic diepoxide | 33.3 | 33.3 | 33.3 | 33.3 | 33.3 | 33.3 | 33.3 |
| Cycloaliphatic monoepoxide | 33.3 | 33.3 | 33.3 | 33.3 | 33.3 | 33.3 | 33.3 |
| Solution of arylsulphoniumhexafluoroantimonates (33%) | 0.5 | 0.5 | 0.5 | 0.5 | 0.5 | 0.5 | 0.5 |
| Benzylthiolanium-hexafluoroantimonate | 0 | 0 | 0.7 | 0.7 | 0 | 0 | 0.7 |
| Carbon black | 0 | 0.1 | 0.1 | 0 | 0 | 0.1 | 0.1 |
| Fused quartz powder (silanized) | 0 | 0 | 0 | 0 | 233 | 233 | 233 |

The mixtures are poured in each case into teflon molds with cylindrical depressions of 25 mm diameter and hardened through UV irradiation with a mercury medium-pressure lamp (approx 100 mW/cm$^2$). A thermal hardening follows at 150° C. within 10 min. The results which are relevant to the invention are summarized in Table 2.

TABLE 2

| Properties of the Mixtures According to Example 1 Through 7 | | | | | | | |
|---|---|---|---|---|---|---|---|
| Example | 1 | 2 | 3 | 4 | 5 | 6 | 7 |
| UV irradiation time (min) | 3 | 5 | 5 | 3 | 3 | 5 | 5 |
| Hardenable layer thickness through pure U.V. radiation (mm) | >2 | 0.5 | 0.5 | >2 | >2 | 0.7 | 0.7 |
| Hardening in deeper areas at 150° C. after 10 min | no | no | yes | yes | no | no | yes |
| Viscosity multiplication in 6 months | <2 | <2 | <2 | <2 | <1.2 | <1.2 | <1.2 | the results show that when only UV irradiation is used, carbon-black containing mixtures are only hardenable in thin layers. The areas in the deeper layers, which are still liquid after the UV hardening, can only be thermally hardened according to the invention when a benzylthiolanium salt is present (Examples 3 and 7). In this case, after hardening for 10 min at 150° C., the entire molded article reaches a glass temperature of $T_G > 150°$ C. (maximum of the loss factor in the dynamic-mechanical analysis at a heating rate of 3 K/min and a frequency of 1 Hz). When the benzylthiolanium salt is absent, the deeper areas remain liquid (Examples 2 and 6).

These results are obtained with filler-free mixtures (Examples 1 through 4) and also with mixtures containing fused quartz powder (Examples 5 through 7). The required storage stability is achieved with all mixtures. With the mixtures of Examples 5 through 7, unhoused, bonded ICs on printed-circuit boards and hybrid circuits can be covered locally, for example with dispenser-applied drops. A carbon black additive is especially necessary for hybrid circuits, in which an active laser trimming is carried out, (Examples 2, 3, 6 and 7). That is, a complete hardening is only possible when the measures according to the invention are applied.

EXAMPLES 8-11

In Examples 8 through 11, epoxy resin mixtures are specified, which are suited for a dipping application. The composition of the applied mixtures can be obtained from Table 3. The individual constituents are specified in mass parts the arylsulphoniumhexafluoroantimonates are present as a solution in propylene carbonate (commercial product). The mixtures are homogenized for 0.5 h at room temperature under a reduced pressure (<10 mbar) and with the exclusion of UV light.

TABLE 3

Composition of the Mixtures According to Examples 8 through 11

| Example | 8 | 9 | 10 | 11 |
|---|---|---|---|---|
| Cycloaliphatic diepoxide | 62.5 | 50 | 50 | 50 |
| Triglyceride of epoxideized soy bean oil | 25.0 | 20 | 20 | 20 |
| Cycloaliphatic alcohol | 12.5 | 10 | 10 | 10 |
| Polypropyleneglycol-monomethacrylate | 0 | 20 | 20 | 20 |
| Solution of arylsulphonium-hexafluoroantimonates (33%) | 1 | 1 | 1 | 0 |
| Benzylthiolaniumhexafluoro-antimonate | 0.5 | 0.5 | 0 | 0.5 |

The properties of the mixtures 9 through 11 which are important in connection with the invention are summarized in Table 4. In the case of the mixture according to Example 8, the time until the initial viscosity is doubled amounts to two months.

TABLE 4

Properties of the Mixtures According to Example 9 Through 11

| Example | 9 | 10 | 11 |
|---|---|---|---|
| Gel time at 130° C. | 75 s | >2 h | 70 s |
| Gel time with UV irradiation | 30 s | 30 s | >30 min |
| Viscosity multiplication in six months | <2 | <2 | <2 |

From Table 4, one can infer that in order to implement a hardening through UV irradiation and by supplying heat, it is necessary for both initiators to be present. Example 9 shows in comparison to Example 11 that the arylsulphoniumhexafluoroantimonate does not considerably influence the gel time when heat is supplied (130° C.). On the other hand, one can infer from Examples 9 and 10 that the benzylthiolaniumhexafluoroantimonate does not influence the gel time in the case of UV irradiation (layer thickness: 0.5 mm; metal-halide radiator; UVA power density: 25 mW/cm$^2$). The required storage stability of the mixtures is also guaranteed when both initiators are present at the same time (Example 9). Example 9 shows—in comparison to Example 8—furthermore that by adding methacrylate, the storage stability of two months is increased to over six months.

Flat printed-circuit board subassemblies can be lacquered with the mixture 9. To this end, the flat subsassemblies are slowly dipped in and out of the low-viscosity resin. After a short drainage time, the lacquer is hardened at the light-accessible places through UV irradiation and it is thermally hardened at 125° C. in the areas that are shaded from light.

What is claimed is:

1. In a process for coating or bonding electronic components and subassemblies with reaction resin mixtures, an improvement comprising using a reaction resin mixture comprising:
   a cationically hardenable, solvent-free epoxy resin;
   a triarylsulphonium hexafluorophosphate, hexafluoroarsenate or hexafluoroantimonate, with a mass concentration of 0.01 to 5% based upon epoxy resin; and
   a benzylthiolanium hexafluorophosphate, hexafluoroarsenate or hexafluoroantimonate, with a mass concentration of 0.01 to 5% based upon epoxy resin;
and hardening the reaction resin mixture through UV radiation and thermally.

2. The process according to claim 1, wherein the thermal hardening takes place at temperatures from 80° to 200° C.

3. The process according to claim 1 wherein the cationically hardenable epoxy resin is selected from the group consisting of glycidyl ethers based on bisphenol A, bisphenol F or novolaks, linear aliphatic epoxy resins, cycloaliphatic epoxy resins, and mixtures thereof.

4. The process according to claim 1 wherein the reaction resin mixture further comprises a hydroxy-group-containing organic compound.

5. The process according to claim 4 wherein the hydroxyl group-containing organic compound is selected from the group consisting of a polyoxyalkylenepolyol, a polyalkylenepolyol, a cycloaliphatic hydroxyl compound, or vinyl ethers thereof.

6. The process according to claim 1 wherein the triarylsulphonium salt exhibits one of the following structures:

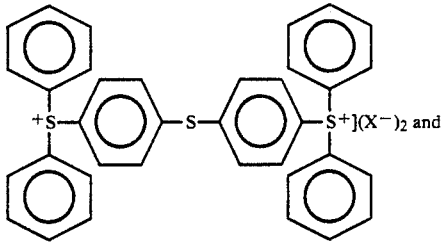

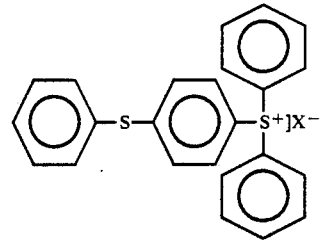

with X$^-$=PF$_6^-$, AsF$_6^-$ or SbF$_6^-$.

7. The process according to claim 1 wherein the benzylthiolanium salt exhibits the following structure:

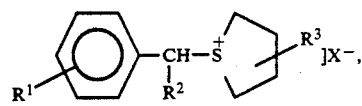

where the following applies:
R$^1$=hydrogen, alkyl, aryl, alkoxy, thioether, halogen, CN or NO$_2$;
R$^2$=hydrogen, alkyl or aryl;
R$^3$=hydrogen, alkyl or aryl or the thiolane ring is the constituent of an aromatic system;
X$^-$=PF$_6^-$, AsF$_6^-$ or SbF$_6^-$.

8. The process according to claim 1 wherein the reaction resin mixture further comprises a tertiary amine with a mass concentration of 0.001 to 1% based upon epoxy resin.

9. The process according to claim 1 wherein the reaction resin, mixture further comprises a (meth)acrylate, with a mass concentration of 1 to 30% based upon epoxy resin.

10. A process for laminar coating of electronic subassemblies comprising the steps of coating an electronic subassembly with a reaction resin mixture comprising:
a cationically hardenable, solvent-free epoxy resin;
a triarylsulphonium hexafluorophosphate, hexafluoroarsenate or hexafluoroantimonate, with a mass concentration of 0.01 to 5% based upon epoxy resin; and
a benzylthiolanium hexafluorophosphate, hexafluoroarsenate or hexafluoroantimonate, with a mass concentration of 0.01 to 5% based upon epoxy resin;
and hardening the reaction resin mixture through UV radiation and thermally.

11. A process for lacquering of printed circuit board assemblies comprising the steps of lacquering a printed circuit board assembly with a reaction resin mixture comprising:
a cationically hardenable, solvent-free epoxy resin;
a triarylsulphonium hexafluorophosphate, hexafluoroarsenate or hexafluoroantimonate, with a mass concentration of 0.01 to 5% based upon epoxy resin; and
a benzylthiolanium hexafluorophosphate, hexafluoroarsenate or hexafluoroantimonate, with a mass concentration of 0.01 to 5% based upon epoxy resin;
and hardening the reaction resin mixture through UV radiation and thermally.

12. A process for applying a localized covering on microelectronic components comprising the steps of covering a localized area of a microelectronic component with a reaction resin mixture comprising:
a cationically hardenable, solvent-free epoxy resin;
a triarylsulphonium hexafluorophosphate, hexafluoroarsenate or hexafluoroantimonate, with a mass concentration of 0.01 to 5% based upon epoxy resin; and
a benzylthiolanium hexafluorophosphate, hexafluoroarsenate or hexafluoroantimonate, with a mass concentric of 0.01 to 5% based upon epoxy resin;
and hardening the reaction resin mixture through UV radiation and thermally.

* * * * *